(12) United States Patent
Morici

(10) Patent No.: US 10,530,352 B1
(45) Date of Patent: Jan. 7, 2020

(54) POWER TRANSITION FILTERING WITH PULSE MODULATED CONTROL

(71) Applicant: Infineon Technologies Austria AG, Villach (AT)

(72) Inventor: Andrea Morici, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/144,728

(22) Filed: Sep. 27, 2018

(51) Int. Cl.

| | |
|---|---|
| H03K 7/08 | (2006.01) |
| H02M 3/157 | (2006.01) |
| H02M 3/158 | (2006.01) |
| H02M 3/335 | (2006.01) |
| H03K 7/06 | (2006.01) |
| G05F 1/10 | (2006.01) |
| H02M 1/00 | (2006.01) |

(52) U.S. Cl.
CPC ............. H03K 7/08 (2013.01); G05F 1/10 (2013.01); H02M 3/157 (2013.01); H02M 3/158 (2013.01); H02M 3/33515 (2013.01); H03K 7/06 (2013.01); H02M 2001/0029 (2013.01); H02M 2001/0032 (2013.01); H02M 2001/0045 (2013.01)

(58) Field of Classification Search
CPC ........ H02M 1/36; H02M 3/156; H02M 3/157; H02M 3/158; H02M 3/33515; H03K 7/06; H03K 7/08
See application file for complete search history.

(56) References Cited

U.S. PATENT DOCUMENTS

| 2005/0194951 | A1* | 9/2005 | Mehas | H02M 1/36 323/282 |
| 2006/0023476 | A1* | 2/2006 | Fosler | H02M 3/157 363/49 |
| 2011/0140626 | A1* | 6/2011 | Aurongzeb | H05B 33/0845 315/250 |
| 2012/0146542 | A1* | 6/2012 | Nerone | H02M 3/156 315/294 |

(Continued)

OTHER PUBLICATIONS

"Understanding CIC Compensation Filters," Application Note 455, ver. 1.0, Apr. 2007, accessed from https://www.intel.com/content/dam/www/programmable/us/en/pdfs/literature/an/an455.pdf, 17 pp.

(Continued)

*Primary Examiner* — David B Lugo
(74) *Attorney, Agent, or Firm* — Shumaker & Sieffert, P.A.

(57) ABSTRACT

The disclosure is directed to implementing a gradual power transition, in digital and mixed-signal power converters. A "soft start" smooths an abrupt power change in the output of a power converter such as when the power converter starts up after turning on the power to a device. A power converter may receive a digital control signal that includes a command to start up, as well as includes a power level set point. This disclosure includes a circuit that receives the digital control signal and outputs a modified control signal to the power converter that causes the power converter to gradually change the power output of the power converter until the power output reaches the power level set point. The circuit dynamically determines a step size, length of time of each step and other parameters based on characteristics of the input digital control signal.

20 Claims, 7 Drawing Sheets

(56) References Cited

U.S. PATENT DOCUMENTS

| | | | | |
|---|---|---|---|---|
| 2013/0147445 A1* | 6/2013 | Levesque | ............... | G05F 1/595 |
| | | | | 323/271 |
| 2014/0070784 A1* | 3/2014 | Lynch | ............... | H02M 3/156 |
| | | | | 323/283 |
| 2018/0351452 A1* | 12/2018 | Clavette | ............... | H02M 3/156 |

OTHER PUBLICATIONS

"LED Drivers ICs for High Power LEDs," ILD6150, Infineon, Data Sheet Revision 3.2, Jul. 9, 2014, 25 pp.
"Dimming Control using a PWM Signal," XDP Digital Power, Infineon, White Paper, Revision 1.0, Nov. 14, 2016, 10 pp.

\* cited by examiner

US 10,530,352 B1

POWER TRANSITION FILTERING WITH PULSE MODULATED CONTROL

TECHNICAL FIELD

The disclosure relates to power converter circuits.

BACKGROUND

Soft start is a feature that power converters implement to smooth transients for abrupt power changes. An abrupt power change may occur, for example, at startup or for other power changes. Soft start can be implemented both in analog and digital domains by passing the signal that controls the power output of the power converter through a low pass filter. The filtered control signal drives the power converter to output a more gradual change in output power, such as a ramp, rather than a large step change.

SUMMARY

In general, the disclosure is directed to circuits and techniques for implementing a gradual power transition, or "soft start" in digital and mixed-signal power converters. A "soft start" smooths an abrupt power change in the output of a power converter such as when the power converter starts up after turning on the power to a device. A power converter may receive a digital control signal that includes both a command to start up as well as includes a power level set point. For example, the power level set point may be any set point between zero and 100% output power. This disclosure includes a circuit that receives the digital control signal and outputs a modified control signal to the power converter that causes the power converter to gradually change the power output of the power converter until the power output reaches the power level set point. The circuit dynamically determines a step size, length of time of each step and other parameters based on characteristics of the input digital control signal.

In one example, the disclosure is directed to a method comprising: receiving an input pulse modulated (PM) signal, determining a target power level setpoint indicated by one or more characteristics of the input PM signal, determining ramp parameters to adjust an output signal to reach the target power level setpoint over a plurality of steps, based on the one or more characteristics of the input PM signal and sending the output signal to a power converter circuit, wherein the output signal changes to reach the target power level setpoint over the plurality of steps according to the determined ramp parameters.

In another example, the disclosure is directed to a device comprising an input element configured to receive a pulse modulated (PM) input signal, a PM analysis unit configured to determine one or more characteristics of the received PM input signal, a control signal generation unit configured to output a control signal, wherein the control signal generation unit is configured to adjust the control signal to match the a power level setpoint indicated by the PM input signal over a plurality of steps, a ramp parameter determination unit configured to determine parameters of the plurality of steps based on the one or more characteristics of the received PM input signal.

In another example, the disclosure is directed to system comprising: a detection circuit that includes: an input element configured to receive a pulse modulated (PM) input signal, a PM analysis unit configured to determine one or characteristics of the received PM input signal wherein the one or more characteristics of the received PM input signal defines a power level set point for the power converter circuit, a control generation unit configured to output a PM output signal, wherein the control generation unit is configured to adjust the control signal to match the power level set point indicated by the PM input signal over a plurality of steps; and a ramp parameter determination unit configured to determine parameters of the plurality of steps based on the one or more characteristics of the received PM input signal. The system also includes a power converter circuit configured to output electrical power to a load, wherein the PM output signal controls a magnitude of the electrical power to change over the plurality of steps and according to the determined ramp parameters, such that the magnitude of power reaches the power level set point.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
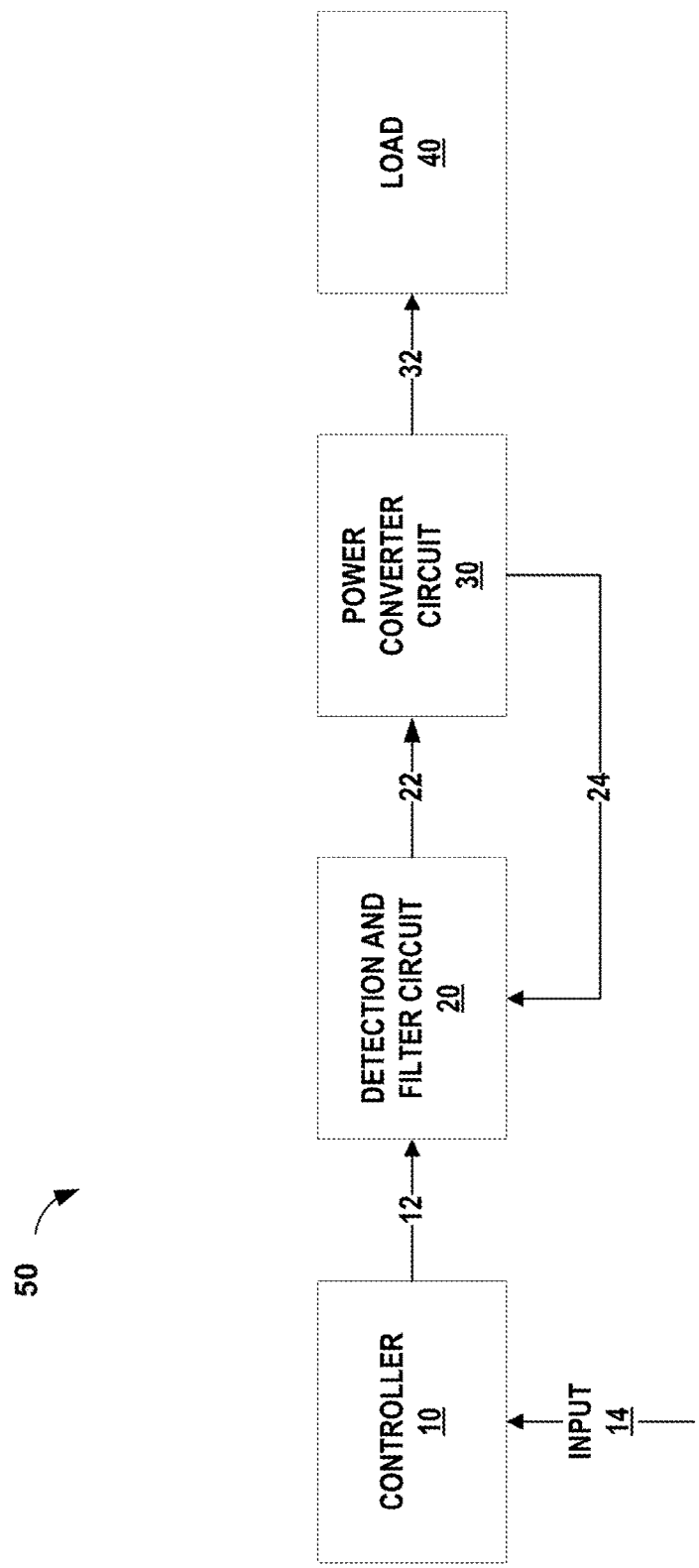
FIG. 1 is a block diagram illustrating an example system that implements the gradual power transition techniques of this disclosure.

This disclosure is directed to circuits and techniques for implementing "soft start" in digital and mixed-signal power converters. A "soft start" is a gradual power transition to smooth an abrupt power change in the output of a power converter such as when the power converter starts up after turning on the power to a device. A power converter may receive a digital control signal that includes a command to start up, as well as a power level set point. For example, the power level set point may be any set point between zero and 100% output power. This disclosure describes a circuit that receives an input digital control signal and outputs a modified control signal to the power converter that causes the power converter to gradually change the power output of the power converter until the power output reaches the power level set point. The circuit dynamically determines a step size, length of time of each step and other parameters based on the characteristics of the input digital control signal.

Soft start techniques of this disclosure also apply a gradual power transition to power changes that occur during power converter operation and not just during start-up. For example, the power level set point may change in response to a change in power demand from the load, or a commanded change, e.g. by a user, in power level set point of the power converter. The power level set point may be sent to the power converter via a signal by a controller, such as a microprocessor. The power converter start-up signal and the power level set point signal may be combined in one signal from the controller. The circuit of this disclosure may apply the soft start filtering to this combined control signal from the controller. Soft start filtering may also be described as soft start conditioning.

The soft start techniques of this disclosure may provide advantages when compared to other soft start techniques. For example, the use of a fixed response low pass filter for soft start may not be flexible enough to adapt to different situations e.g. using a given power converter design in a variety of different applications and different use cases. Thus, in some examples, the soft start for an analog controller is tuned with an external resistor-capacitor (RC) or similar type of external low pass filter. The external low pass filter provides flexibility to select different low pass filter components as needed to apply the same power converter design to different applications, but requires external pins and additional components to be included with the power converter.

Similarly, for digital controllers, soft start can be tuned with an external or internal digital filter as for the analog controllers, which in some examples requires the added expense of a controller pin and an analog to digital converter (ADC) circuit. In other examples, the soft start could be implemented with a specific controller parametrization (e.g. where the ramp characteristics are provided externally), with the added expense of a parametrization interface and non-volatile memory.

In contrast, the techniques of this disclosure provide a dynamic soft start for digital and mixed signal power converters that receive start-up and power level set point control from a digital control signal. The digital control signal characteristics, such as duty cycle and frequency, determine the power level set point. The techniques of this disclosure dynamically determine the gradual power transition, e.g. step size and step length, based on the digital control signal characteristics. The modified output signal to the power converter is based on the input digital control signal characteristics and ramps the power converter output signal to the power level set point without the need for customized external components, extra pins, an ADC, a parametrization interface nor a non-volatile memory.

FIG. 1 is a block diagram illustrating an example system that implements the gradual power transition techniques of this disclosure. The example of system 50 is just one possible implementation of the techniques of this disclosure. In other examples, some functions of system 50 may be combined or system 50 may include more or fewer functions than depicted in the example of FIG. 1.

In the example of FIG. 1, system 50 includes controller 10, detection and filter circuit 20, power converter circuit 30 and load 40. System 50 may be used to control the power to a load in a variety of applications, including lighting, such as light emitting diodes (LED) in an automotive application, speed and power output of an electric motor, industrial power application, computer and server power applications, audio-visual power and other types of power applications.

In some examples, controller 10 may output control signal 12 in response to an input signal 14 to the controller. For example, a user may manually change a desired set point on an input device to controller, such as turning a knob. In another example, such as a headlight system on an automobile, a light sensor may detect a change in lighting in the environment, such as when the automobile enters a tunnel. The decreased lighting in the tunnel may cause and input signal 14 to the controller to change the headlight brightness output by changing control signal 12 to a power converter that controls the headlight brightness.

Controller 10 may output a control signal 12 that changes the power output from power converter circuit 30 to load 40. Control signal 12 may be a pulse modulated signal, for example, a pulse width modulated (PWM) signal with one or more characteristics that define a power level set point for power converter circuit 30. Some example characteristics of control signal 12 may include the duty cycle, frequency, amplitude, and similar characteristics. Control signal 12 may also include characteristics that cause power converter circuit 30 to start up from a sleep state or an off-state, or to turn off power converter circuit 30. In the example in which load 40 is a lighting load, such as one or more LEDs, control signal 12 may also be referred to as a dimming signal.

In other examples, control signal 12 may include other types of PM signals. In addition to PWM, control signal 12 may also be pulse frequency modulation (PFM), pulse density modulation (PDM) and similar PM schemes. PWM may be considered a subset of PDM where the switching frequency is fixed and all the pulses corresponding to one sample are contiguous in the digital signal. For a 50% voltage, a PWM waveform will turn on for half a period then off for the remaining part of the period. For a 50% PDM and the same clock rate the signal would alternate between on and off every other clock cycle. In other examples, PFM uses a constant duty cycle, then modulates the square wave's frequency to achieve regulation. Some voltage converters that may be equipped with constant-on-time or constant-off-time control are examples of PFM architecture. In other examples, a power converter may be a hysteretic voltage converter. In a hysteretic control scheme a power converter switch is turned on and off based on changes in output-voltage sensed by the power converter. A hysteretic control scheme may be referred to as a "ripple regulator" or "bang-bang controller" because it continuously shuttles the output voltage back and forth to just above or below the power level set point. Hysteresis is used to maintain predictable operation and to avoid switch chatter. The duty cycle for control signal 12 used for a hysteretic power converter may stay constant but the switching frequency may vary because the hysteretic architecture varies the drive signal to the switch based on the operating conditions of the power converter circuit.

Examples of controller 10 may include, any one or more of a microprocessor, a microcontroller (MCU), e.g. a computer on a single integrated circuit containing a processor core, memory, and programmable input/output peripherals, a microprocessor (μP), e.g. a central processing unit (CPU) on a single integrated circuit (IC), or other types, a digital signal processor (DSP), an application specific integrated circuit (ASIC), a field-programmable gate array (FPGA), a system on chip (SoC) or equivalent discrete or integrated logic circuitry. Controller 10 may be integrated circuitry, i.e., integrated processing circuitry, and that the integrated processing circuitry may be realized as fixed hardware processing circuitry, programmable processing circuitry and/or a combination of both fixed and programmable processing circuitry.

Detection and filter circuit 20 may intercept control signal 12 and output a modified control signal 22 to power converter circuit 30. Detection and filter circuit 20 may be considered a device configured to receive and analyze the characteristics of control signal 12. Based on the analyzed characteristics of control signal 12, detection and filter circuit 20 may determine whether to output a modified control signal 22 that will gradually turn off, turn on or otherwise change the power level set point for power converter circuit 30. In some examples detection and filter circuit 20 may gradually adjust modified control signal 22 to match control signal 12 over a series of steps.

Modified control signal 22 may match control signal 12 when modified control signal 22 causes power converter circuit 30 to output the same power level setpoint as indicated by control signal 12. Each characteristic of modified control signal 22 may not be identical to control signal 12. For example, the frequency of modified control signal 22 may differ from control signal 12, but still cause power converter 30 to output at the same power level setpoint as indicated by control signal 12. In some examples, modified control signal 22 is a digital word that causes power converter 30 to output power at the indicated power level setpoint.

Detection and filter circuit 20 may dynamically determine ramp parameters, e.g. step size and step length of the series of steps based on the one or more characteristics of the received input control signal 12. Modified control signal 22 may cause the power converter output signal 32 to ramp to the power level set point. Detection and filter circuit 20 may output modified control signal 22 to cause power converter output signal 32 to either ramp up to an increased set point or ramp down to a decreased set point. In this manner, detection and filter circuit 20 may cause a gradual power transition to smooth an abrupt power change such as when control signal 12 signals a startup. In some examples, detection and filter circuit 20 may control the ramp parameters based on the frequency of control signal 12.

Power converter circuit 30 may include a variety of digitally controlled power converter types, such as a buck converter, a boost converter, a linear converter, including a low drop out (LDO) linear converter, and other types of power converters. Power converter circuit 30 may receive the digital instructions included in modified control signal 22 to control one or more parameters of the power output. Detection and filter circuit 20 may dynamically adjust modified control signal 22 to gradually change the output power of power converter circuit 30 to the desired power level setpoint.

In some examples, changes in the power needs of load 40 may cause a change in the power required from power converter circuit 30. For example, the mechanical load on a motor may increase, e.g. such as for a vehicle going up an incline. The increased mechanical load may require additional electrical power from power converter circuit 30. Power converter circuit 30 may signal detection and filter circuit 20 via feedback signal 24 to indicate the change in power level set point. In some examples, detection and filter circuit 20 may determine the new power level setpoint based on feedback signal 24 and gradually change modified control signal 22 to cause power converter circuit 30 to increase to the new power level setpoint.

Feedback signal 24 may be any type of signal including a PM signal, numerical signal or logical signal depending on the configuration of detection and filter circuit 20 and power converter circuit 30. Detection and filter circuit 20 may include a prioritization circuit, or other technique, to ensure that modified control signal 22 follows the appropriate input signal, i.e. control signal 12 or feedback signal 24. In the example in which feedback signal 24 is a PM signal, detection and filter circuit 20 may internally include a minimum select block (not shown in FIG. 1) that receives both control signal 12 and feedback signal 24 and outputs a PM signal that the remaining circuitry in detection and filter circuit 20 may ramp up or down as described above. In other examples, such as when feedback control signal 24 is a numerical or logical signal, then feedback control signal 24 may impact other portions of the circuitry within detection and filter circuit 20.

As one example in which the output power from power converter 35 may be decreased in a controlled manner, load 40 may be an LED module that is disconnected from power converter 30 during operation. When disconnected, power converter circuit 30 can no longer supply current and overvoltage protection circuitry within power converter 30 may trigger power converter 30 to power OFF, i.e. go to a power level setpoint of zero percent. Feedback signal 24 may convey the zero power level setpoint to detection and filter circuit 20, which subsequently outputs modified control signal 22 to gradually decrease the power output of power converter 30.

The power level set point may determine an output parameter of output signal 32 for power converter circuit 30. Some examples of output parameter may include output power, output voltage and output current. Changes to control signal 12 and modified control signal 22 may control one or more of the output parameters.

The inclusion of detection and filter circuit 20 into system 50 may provide several advantages when compared to other types of gradual power transition (soft start) techniques. Detection and filter circuit 20 allows a simplified design for controller 10 because controller 10 may send control signal 12 to either increase or decrease the power level set point directly to any new value regardless of step size, 75% power to 10% power, OFF to 100% power and so on. Detection and filter circuit 20 receives control signal 12 will dynamically control the ramp parameters, i.e. number of steps, step size, and step length and output modified control signal 22 to apply a soft start ramp to the new power level set point. Because detection and filter circuit 20 manages the soft start, the controller design, e.g. the firmware, may be less complex, with reduced development and testing cost. Similarly, because detection and filter circuit 20 dynamically controls the ramp parameters based on the frequency of control signal 12, a circuit designer for system 50 may select an appropriate PM frequency to determines the speed for the output parameter of power converter circuit 30 reaches the target value. For example, selecting a lower PM frequency for control signal 12 may result in a slower soft start, e.g. more steps, smaller step size and/or longer step length. Selecting a higher PM frequency for control signal 12 may correspond a faster soft start. Therefore, detection and filter circuit 20 of this disclosure does not require a separate control signal, or separate setup, such as external components or programming, to set the ramp parameters. Also, detection and filter circuit 20 of this disclosure may provide improved performance when compared to RC filtering for analog control signals by preserving the signal information with high resolution. For example, detection and filter circuit 20 may ramp down to and up from very low dimming levels, e.g. less than 1% of full output power.

Figure 2:
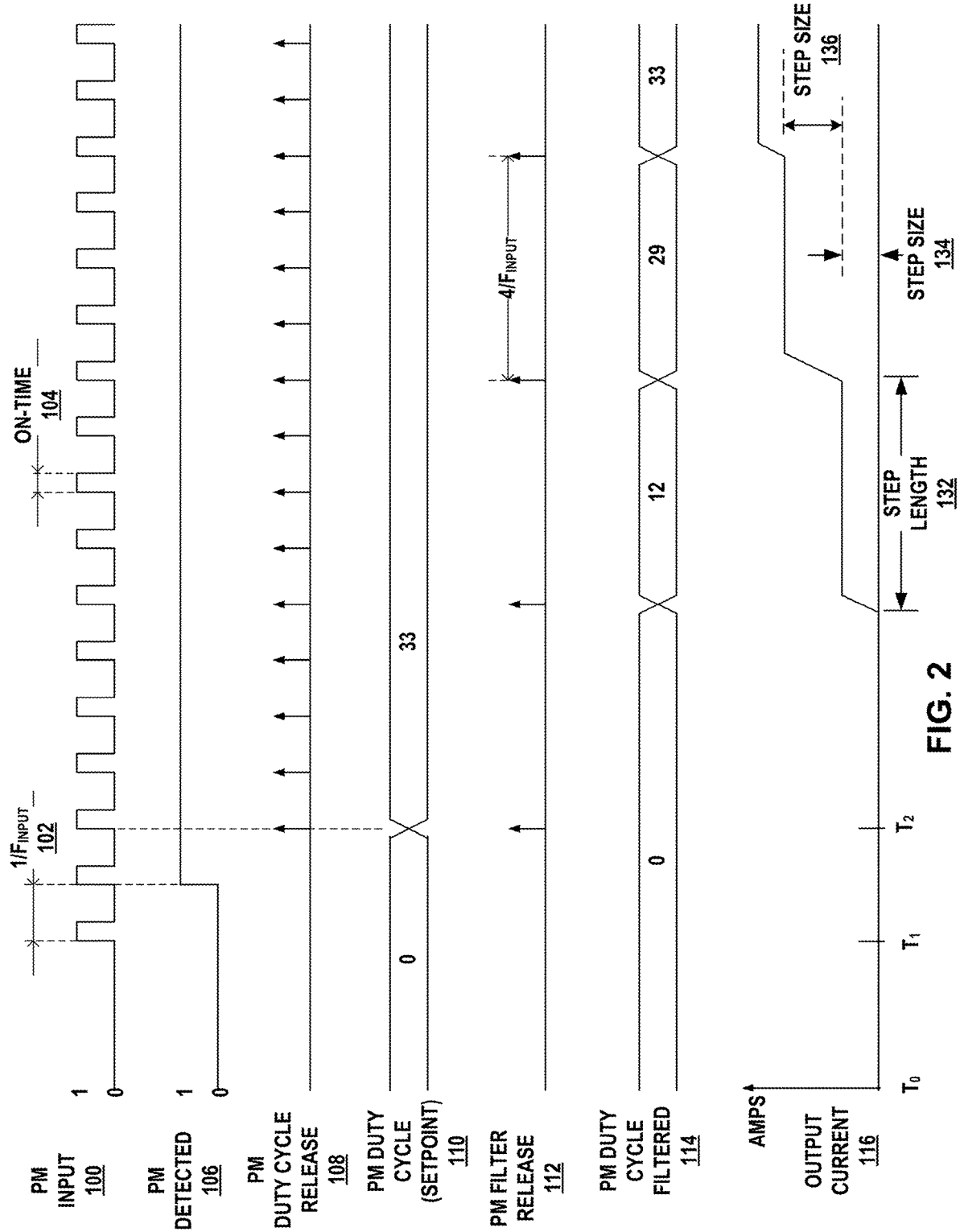
FIG. 2 is a timing diagram illustrating an example implementation of the soft start techniques of this disclosure.

FIG. 2 is a timing diagram illustrating an example implementation of the soft start techniques of this disclosure. The example of FIG. 2 depicts one example of a start-up from OFF to a dimming level of 33 and illustrates how the input frequency may determine the ramp parameters. The details of FIG. 2 are just one example of an implementation of the techniques of this disclosure. In other examples, the techniques of this disclosure may be implement in other ways.

PM input signal 100 may correspond to control input 12, which is output from controller 10 as described above in relation to FIG. 1. PM input signal 100 has signal characteristics including frequency (Finput) and a duty cycle. The period 102 of PM input signal 100 is 1/Finput. The duty cycle is the on-time 104 divided by the period 102.

At time $T_0$, the example of FIG. 2 depicts PM input signal 100 as OFF and PM duty cycle filtered signal 114 is set to zero, indicating that the output from a power converter, e.g. output signal 32 from power converter 30 described above in relation to FIG. 1, should be OFF. For example, output current 116, is a parameter of an output signal from a power converter, such as a parameter output signal 32. Other parameters of an output signal may include power and voltage (not shown in FIG. 2). At time $T_0$, output current 116 is off. In other examples, a power converter may be configured for an inverted control signal in which a zero from PM duty cycle filtered signal 114 indicates the power converter should be at 100% power.

At time $T_1$, PM input signal 100 starts with frequency Finput and duty cycle as shown in FIG. 2. PM input signal 100 at time $T_1$ may be considered a target PM signal. One or more characteristics of the target PM signal define a power level set point for a power converter circuit. The power level set point determines an output parameter for the power converter circuit, such as output current 116. In the example of FIG. 2, the duty cycle of PM input signal 100 determines the power level setpoint and the frequency Finput controls the ramp parameters. In other examples, the frequency Finput, and/or duty cycle of PM input 100 may determine the power level setpoint.

A filter circuit, such as detection and filter circuit 20 described above in relation to FIG. 1, may receive the target PM signal at time $T_1$ and may include an internal PM detected signal 106. Once the filter circuit detects PM input signal 100, the filter circuit may determine one or more characteristics of the target PM signal, such as the duty cycle. In the example of FIG. 2, the filter circuit includes an internal signal, PM duty cycle release 108 that is synchronized to the rising edge of the on-time of PM input signal 100. In other examples, PM duty cycle release 108 may be synchronized to the falling edge, the mid-point, or any other position of the on-time of PM input signal 100.

The filter circuit may determine the power level set point based on the characteristics of PM input signal at time $T_2$. In the example of FIG. 2, the filter circuit determines the power level set point to be 33% at time $T_2$, after three cycles of PM input signal 100. In other examples, the filter circuit may determine the power level set point after less than or more than three cycles. As indicated by the setpoint signal 110, until time $T_2$, the filter circuit determines the setpoint to be zero. After time $T_2$, the filter circuit determines the set point to be 33%. In the example of FIG. 2 the number 33 in signals 110 and 114 is described in this disclosure as indicating 33% power. However, in other examples, the values in signals 110 and 114 may indicate a different value depending on the scaling implementation of the filter circuit. For example, full-scale, i.e. 100% may be indicated by $2^8=256$. Therefore, a value of 33 may indicate approximately 33/256=13%.

Based on the frequency of PM input signal 100, the filter circuit determines the step length and step size. As shown by PM filter release signal 112, the filter circuit in the example of FIG. 2 determines the step length 132 to be four cycles, i.e. 4 periods, of PM input signal 100 (4/Finput). In other examples, a filter circuit may determine the step length to be a different multiple of the input frequency, a fractional multiple of the input frequency, or any other function of the input frequency. In the example of FIG. 2, as the frequency of PM input signal 100 changes, the ramp parameters, e.g. step length may change.

In some examples, the filter circuit may also determine ramp parameters of step size and number of steps for a modified control signal to cause an output parameter, e.g. output current 116, to reach the power level set point defined by PM input signal 100. In the example of FIG. 2, PM duty cycle filtered signal 114 depicts three steps with step size 136 from zero to 12 to 29 and finally to the power level set point of 33%. PM duty cycle filtered signal 114 may correspond to modified control signal 22 described above in relation to FIG. 1. The step length 132 is shown as 4/Finput for each step. PM duty cycle filtered signal 114 may correspond to modified control signal 22 described above in relation to FIG. 1. PM duty cycle filtered signal 114 may cause an output parameter of a power converter, e.g. output current 116 to ramp up in three steps from zero, to 12%, to 29% and finally to match the set point of 33%. In other words, the filter may be configured to receive PM input signal 100 and further configured to adjust PM duty cycle filtered signal 114, to match the power level set point indicated by PM input signal 100 over a plurality of steps. Said another way, PM duty cycle filtered signal 114 is a digital word that changes to the target power level setpoint indicated by PM input signal 100, over the series of steps according to some determined step parameters such as step length 132 and step size 134.

As depicted in FIG. 2, the step size 134 between each step is not equal. In other examples, the step size 134 between each step may be equal. Also, in other examples the number of steps may be greater than or less than three steps. In some examples, the frequency of PM input signal 100 may determine the speed for the output parameter of power converter circuit 30 reaches the target value, e.g. the number of steps. The number of steps of the soft start ramp may vary depending on the actual and the target dimming level.

FIG. 3 is a block diagram illustrating an example hardware implementation of the soft start techniques of this disclosure. Detection and filter circuit 200 may correspond to detection and filter circuit 20 described above in relation to FIG. 1. Detection and filter circuit 200 of FIG. 3 is just one example implementation of the techniques of this disclosure. In other examples, the functional blocks of detection and filter circuit 200 may be combined and there may be more or few functional blocks than depicted in the example of FIG. 3.

In the example shown in FIG. 3, detection and filter circuit 200 may include a clock 202, a divider circuit 210, a sampling and glitch filter unit 206, on-time and period counters 220, a divider unit 230 and a digital filter 240. As described above in relation to FIGS. 1 and 2 above, detection and filter circuit 200 may be configured to receive target PM modulated input signal 204, and output filtered duty cycle signal 242. Filtered duty cycle signal 242 may correspond to modified control signal 22 (see FIG. 1) and to PM duty cycle filtered signal 114 (see FIG. 2). Detection and filter circuit 200 may adjust filtered duty cycle signal 242 to match the power level setpoint indicated by PM input signal 204 over a series of steps.

Clock 202 may be part of detection and filter circuit 200. In some examples, clock 202 may be a signal external to detection and filter circuit 200 and received at a clock input to detection and filter circuit 200. The output from clock 202 may connect to divider circuit 210 and be reduced to a lower clock rate. For example, clock 202 may output a 50 MHz signal, which is received by divider circuit 210. Divider circuit 210 may output divided clock signal of 5 MHz (i.e. divided by ten). In other examples, clock 202 may output a clock signal at a different frequency and divider circuit 210 may divide the clock signal by a different ratio. In the example of FIG. 3, clock 202 feeds the output clock signal to sampling and glitch filter unit 206 and on-time and period counters 220. Divider circuit 210 feeds the divided output to divider unit 230.

Sampling and glitch filter unit 206 may include and input element to receive PM input signal 204. Sampling and glitch filter unit 206 may digitize PM input signal 204 by determining the value e.g. a voltage of the input signal at equidistant time instants (sampling period). In some examples, Sampling and glitch filter unit 206 may digitize the input signal by oversampling the input signal. In some examples, spikes or glitches caused by, e.g. switching gate drivers may create false edges of a PM signal and cause a wrong measurement of signal characteristics, such as pulse width. Some examples of digital signal processing may not recognize a pulse width in PM input signal 204 below a certain limit (e.g. than 35 μs), detection and filter circuit 200 may include a glitch, or spike, filter with the same filter duration (e.g. 35 μs) to blank out any shorter spikes that may affect signal measurement.

Sampling and glitch filter unit 206 may output start-stop signal 208 to on-time and period counters 220. Start-stop signal 208 may include PM detected signal 106 described above in relation to FIG. 2.

On-time and period counters 220 may include circuitry to determine on-time, duty cycle and the frequency characteristics of PM input signal 204. On-time and period counters 220 may output a signal indicating the on-time 222, period 224 as well as a release signal 226 to division unit 230. The signal indicating the on-time 222 may correspond to on-time 104 as depicted in FIG. 2. The signal indicating the period may correspond to 1/Finput 102 depicted in FIG. 2. Release signal 226 may correspond to PM duty cycle release signal 108 depicted in FIG. 2. In other words, on-time and period counters 220 may be considered a component of a PM analysis unit configured to determine one or more characteristics of the received PM input signal.

Division unit 230 may receive the inputs for on-time 222 and period 224 and output a signal indicating the duty cycle 232 to digital filter 240. Division unit 230 may be considered a specific implementation of a duty cycle generation unit and a component of a PM analysis unit.

Division unit 230 may also output a divided release signal to digital filter 240. Release signal 234 may correspond to PM filter release signal 112 depicted in FIG. 2. As described above in relation to FIG. 2, PM filter release signal 112, may be used by digital filter 240 to determine the step length 132 of the ramp parameters. In the example of FIG. 2 the step length was set as four periods of PM input signal 100 (4/Finput).

Detection and filter circuit 200 may also include digital filter 240. Digital filter 240 may receive the duty cycle signal 232 from division unit 230. Digital filter 240 may also receive release signal 234 at clock input 244. Digital filter 240 may output filtered duty cycle signal 242 to a power converter circuit. As described above, filtered duty cycle signal 242 may correspond to modified control signal 22 described above in relation to FIGS. 1 and 2. In other words, digital filter 240 may be considered a signal generation unit configured to output a control signal, wherein the signal generation unit is configured to adjust filtered duty cycle signal 242 to match the power level set point indicated by PM input signal 204 over a series of steps.

Figure 3A:
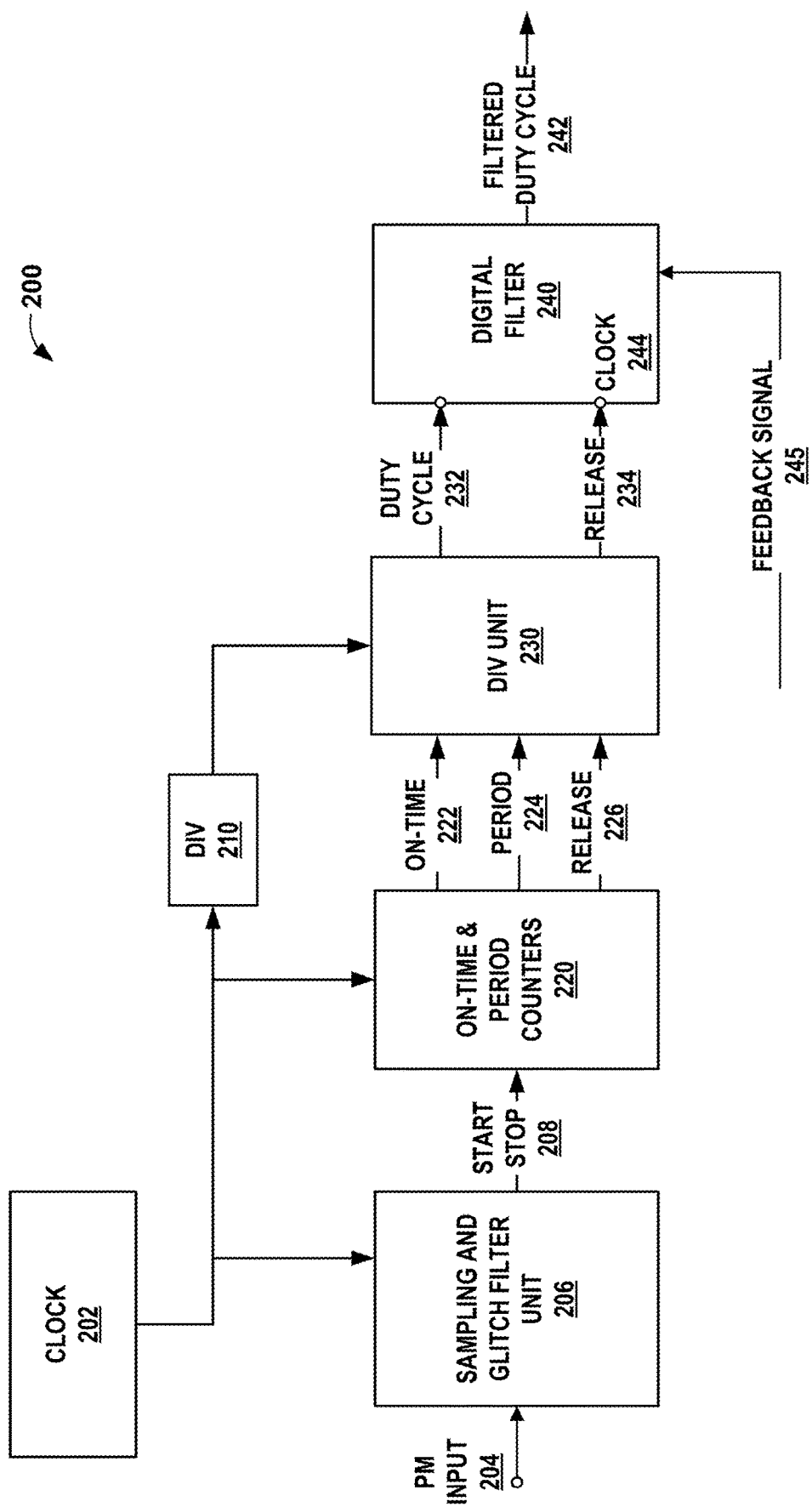
FIG. 3A is a block diagram illustrating an example hardware implementation of the soft start techniques of this disclosure.

In some examples, detection and filter circuit 200 may also receive feedback signal 245 from the power converter unit. Feedback signal 245 may correspond to feedback signal 24 described above in relation to FIG. 1. In the example of FIG. 3A, feedback signal 245 may be a numerical, logical or similar signal that may override the power setting indicated by PM input 204. For example, in the event the load to the power converter develops a fault, or is disconnected, protection circuitry within the power converter may cause the power converter's output to go to zero. Detection and filter circuit 200 may receive feedback signal 245 and output filtered duty cycle 242 to gradually cause the output of the power converter to decrease.

Division unit 230, along with on-time and period counters 220 and digital filter 240 may also be considered a step parameter determination unit configured to determine step parameters, or ramp parameters of the series of steps. The ramp parameters may be based on one or more characteristics of the received PM input signal 204.

Figure 3B:
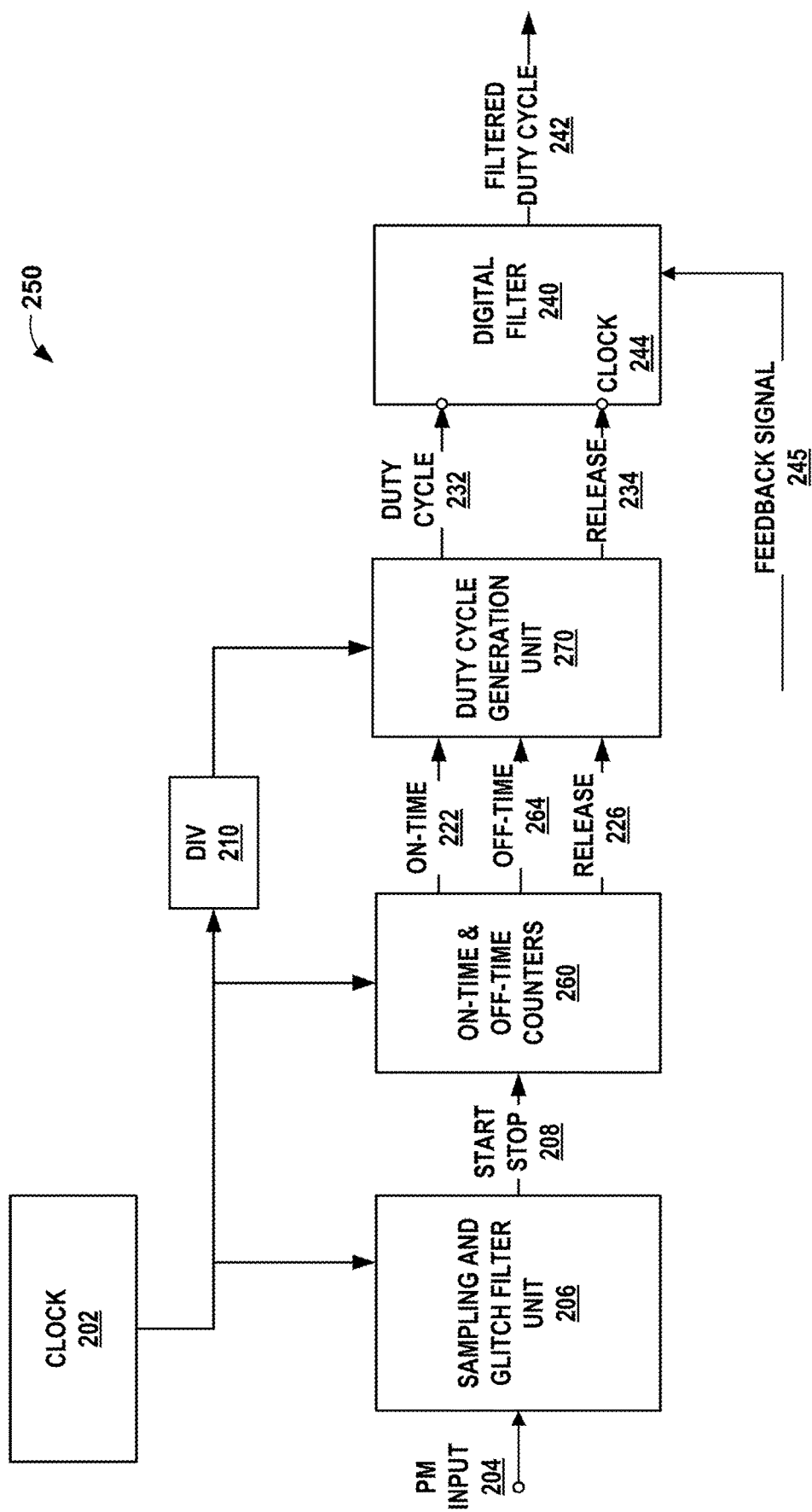
FIG. 3B is a block diagram illustrating another example hardware implementation of the soft start techniques of this disclosure.

FIG. 3B is a block diagram illustrating another example hardware implementation of the soft start techniques of this disclosure. Items with the same reference numbers as depicted in FIG. 3A have the same functions as described above in relation to FIG. 3A.

In the example of FIG. 3B, on-time and period counters 220 has been replaced by on-time and off-time counters 260. Also, duty cycle generation unit 270 has replaced division unit 230.

On-time and off-time counters 260 may include circuitry to analyze the sampled and filtered PM input signal 204 from sampling and glitch filter unit 206 to determine the on-time and the off-time of the PM input signal. On-time and off-time counters 260 may output on-time signal 222 and off-time signal 264 to duty cycle generation unit 270. Duty cycle generation unit 270 may output a signal indicating the duty cycle 232 and release signal 234 to digital filter 240.

Figure 4:
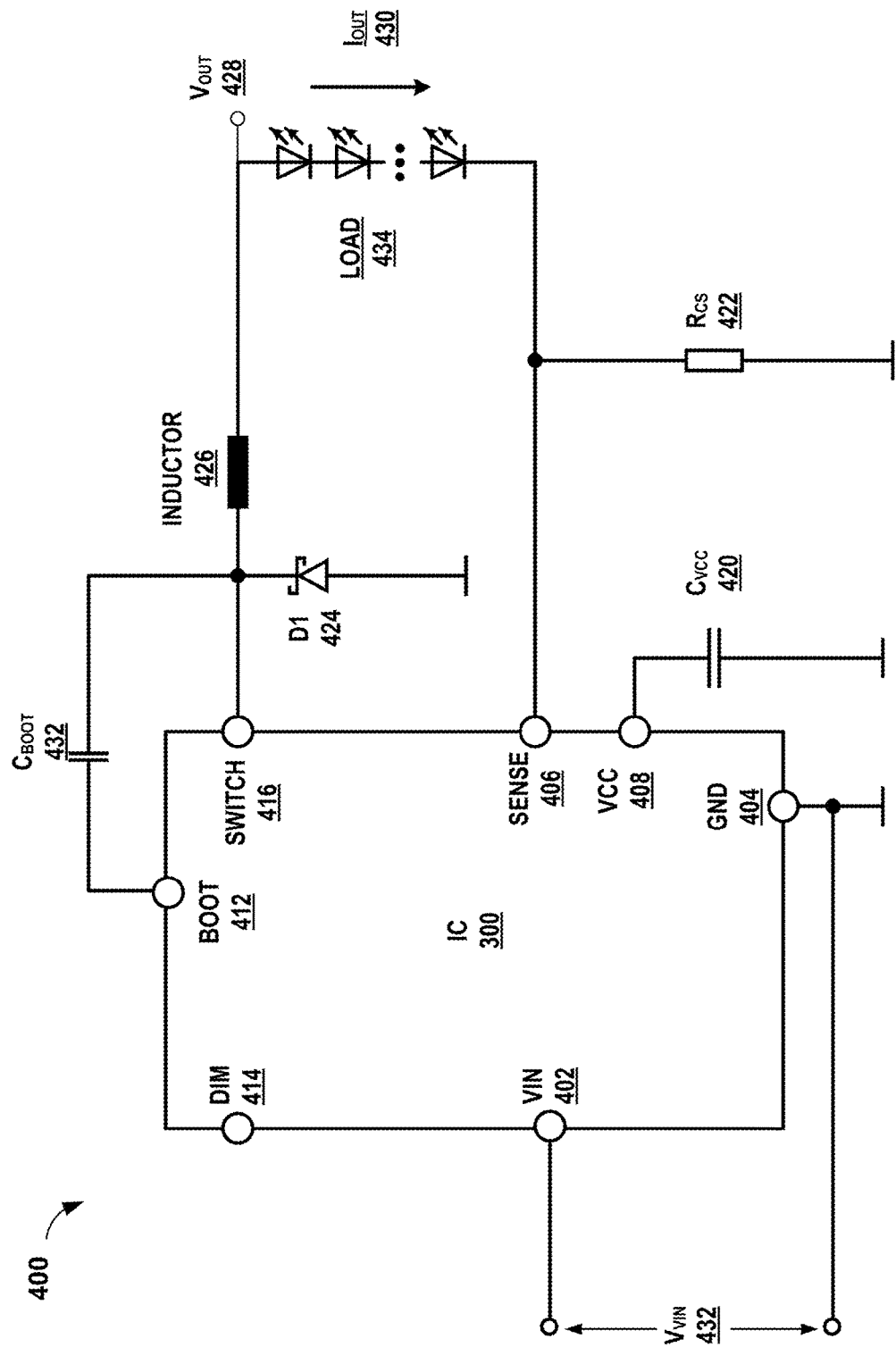
FIG. 4 is a conceptual and schematic illustrating an example integrated circuit package implementation of the soft start techniques of this disclosure.

FIG. 4 is a conceptual and schematic illustrating an example integrated circuit package implementation of the soft start techniques of this disclosure. IC 300 may include the functions of detection and filter circuit 200 and detection and filter circuit 20 described above in relation to FIGS. 1-3. Circuit 400 depicts an example of a boost power converter circuit that includes IC 300. In this disclosure, IC 300 may also be described as including a detection circuit or PM control signal detection circuit.

In the example of circuit 400, IC 300 may include the following terminals, or pins. Switch terminal 416, which may be an internal switch output of a boost power converter switch. Switch terminal 416 couples to a load through inductor 426. In the example of circuit 400, load 434 is a string of LEDs. In other examples, a circuit including the functions included in IC 300 may be applied to other types of loads. IC 300 supplies load 434 with an output including output parameters of voltage, Vout 428 and current Iout 430.

BOOT terminal 412, in the example of circuit 400, comprises an internal switch driver bootstrap for the output switch connected to switch terminal 416. Boot terminal 412 connects to switch terminal 416, as well as to inductor 426 and the cathode of diode D1 424 through bootstrap capacitor $C_{BOOT}$ 432. The anode of diode D1 424 connects to ground as does ground pin 404 of IC 300.

Dimming signal terminal 414 comprises the input element for the PM input signal, such as PM input control signal 12 described above in relation to FIG. 1 and PM input signal 100 described above in relation to FIG. 2. In some examples, dimming signal terminal 414 may be internally pulled-up, which may cause IC 300 to be set to 100% dimming, even if no control signal is connected. Therefore, when circuit 400 is powered up, the power level setpoint will be set to a target of 100%. IC 300 may gradually increase the output parameters to load 434 over a series of steps to reach the 100% setpoint.

Sense terminal 406 comprises the current sense feedback for IC 300. Sense terminal 406 connects to sense resistor $R_{CS}$ 422. Sense resistor $R_{CS}$ 422 connects load 434 to ground. IC 300 may measure the voltage across sense resistor $R_{CS}$ 422 to monitor the current Iout 430 through load 434.

VCC terminal 408 comprises the output of an internal voltage regulator to supply operating voltage to IC 300. VCC terminal 408 may connect to ground through bypass capacitor $C_{VCC}$ 420. IC 300 receives input power at the power input terminal $V_{IN}$ 402. Though not explicitly shown in FIG. 4, IC 300 may also include logic functions, protection circuits, such as over temperature and over voltage protection, digital-to-analog converter (DAC) circuitry and other related circuitry. Some other examples of circuitry that may be part of IC 300 may include one or more digital filters such as a cascaded integrator-comb (CIC) type of finite impulse response (FIR) filter, a recursive digital filter such as an infinite impulse response (IIR), or other types of digital filters.

In operation, IC 300 may be a part of power converter circuit 400 that is configured to output electrical current to a load. A PM output signal, internal to IC 300, controls a magnitude of the electrical current Iout 430 to change over a series of steps according to the determined step parameters to reach a target power level set point. IC 300 may receive an input control signal that includes the target power level set point at an input element, which in the example of IC 300 is the dimming signal input element 414. Based on the frequency, and other characteristics of the input control signal, IC 300 may control the output power from switch terminal 416 such that the magnitude of current reaches the power level set point. In this disclosure, IC 300 may be described as including a detection circuit or PM control signal detection circuit. As described above in relation to FIG. 1, changing the duty cycle and/or frequency of the PM control signal to dimming signal input element 414 may change the power level set point, as well as the ramp characteristics.

As described above in relation to FIG. 1, the input signal received at dimming signal terminal 414 may be output by a controller, similar to controller 10. Controller 10 may receive a signal to adjust the power level setpoint from a user input at a user interface (not shown in FIG. 4). In some examples, IC 300 may control the output parameters, e.g. output current, based on hysteretic control, as described above in relation to FIG. 1, however in other examples other types of regulation may be used with the techniques of this disclosure.

Use of a circuit like IC 300 may have an advantage of simplified controller design, as described above. That is, the controller need only output an on-off and desired power level setpoint to IC 300. IC 300 may control the power to load 434, including gradual ramps up or down as needed in response to changes in power level setpoint from the controller. IC 300 may have an additional advantage over an analog controller IC in that to control gradual ramps up or down, an analog controller may use a low pass filter. A low pass filter may require additional external components, beyond the components used for the power converter. In other words, a digital IC like IC 300 may only use the power converter components, such as inductor 426. An analog controller may require additional external capacitor and resistor for the low pass filter at a higher cost and increased complexity.

Also, as described above in relation to FIG. 3, the internal components of IC 300 do not need to include a microprocessor core, memory or other complex and expensive circuitry to detect and analyze the input PM control signal and generate the stepped modified output control signal to the power converter. IC 300 may only use general purpose input/output (GPIO) to detect and analyze the PM control signal.

Figure 5:
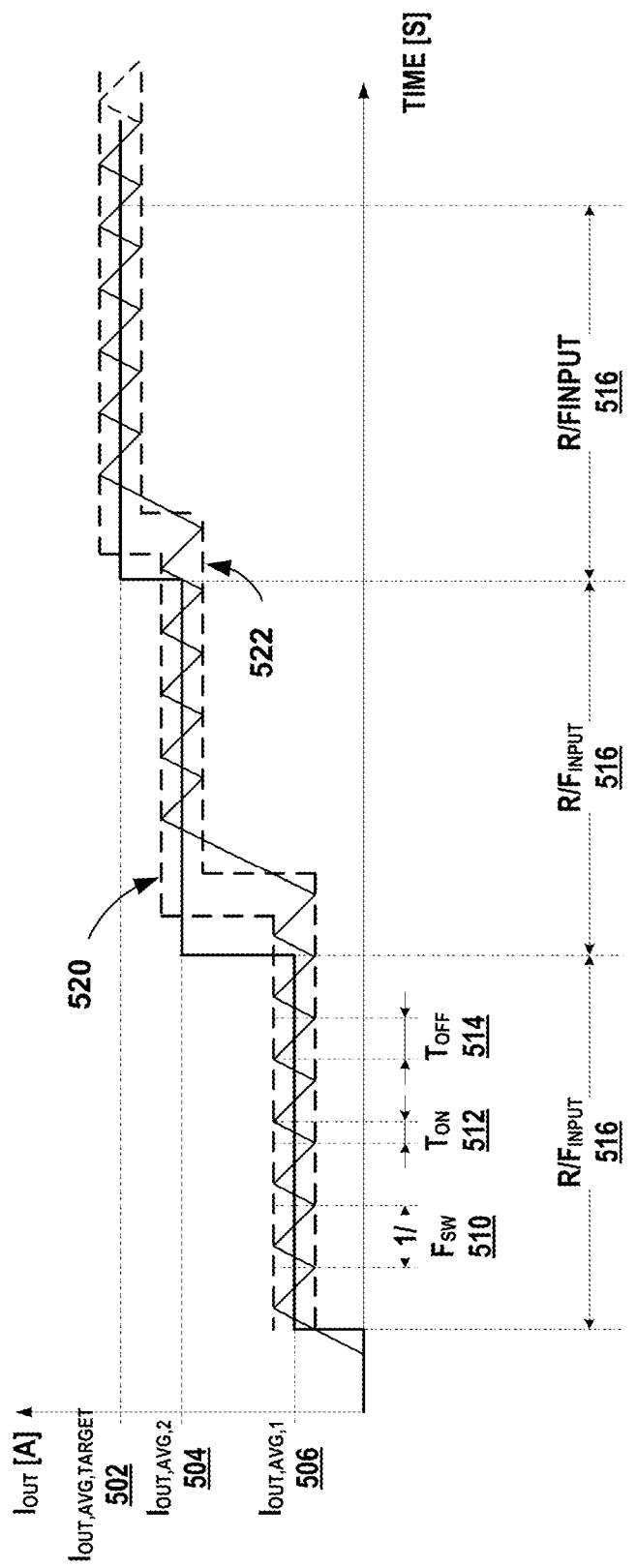
FIG. 5 is a timing diagram illustrating an example of changes to an output current to a load according to one or more techniques of this disclosure.

FIG. 5 is a timing diagram illustrating an example of changes to an output current to a load according to one or more techniques of this disclosure. FIG. 5 depicts an output parameter of a power converter, which is average current in the example of FIG. 5, gradually ramping to a target power level setpoint, $I_{OUT,AVG,TARGET}$ 502 over a series of steps. The step length $R/F_{INPUT}$ 516 is a ratio factor, R, divided by the frequency of the input control signal $F_{INPUT}$. In the example of FIG. 2, the division factor was four, resulting in a step length 132 of $4/F_{INPUT}$. In other examples, the division factor may be greater than or less than four. In other examples, the step length may be mapped to characteristics of the PM input signal by a variety of techniques. Some of the mapping techniques may depend on choice of filter type, e.g. FIR, IIR, and other example filters.

The characteristics of the PM input signal, as well as the power level setpoint, may also determine other ramp parameters such as number of steps and step size. In the example of FIG. 5, the number of steps is three. The average current for the first step is $I_{OUT,AVG1}$ 506. The average current for the second step is $I_{OUT,AVG2}$ 504. In other examples, depending on the type of digital filter, the design of the filter, e.g. the number of poles, and other circuitry included, for example in IC 300 depicted in FIG. 4, the number of steps as well as other ramp parameters may be different.

The actual current for each step depicted in the example of FIG. 5 shows a hysteretic pattern with a maximum current for each step 520 and a minimum current for each step 522. The switching period, $1/F_{SW}$, 510 is set by the power converter switching frequency and may be different than the frequency of the PM input signal. The switching frequency may be set by an internal clock, such as clock 202, depicted in FIG. 3. The switching period 510 may result in an on-time $T_{ON}$ 512, in which the output current increases and an off-time $T_{OFF}$ 514, in which the output current decreases.

Figure 6:
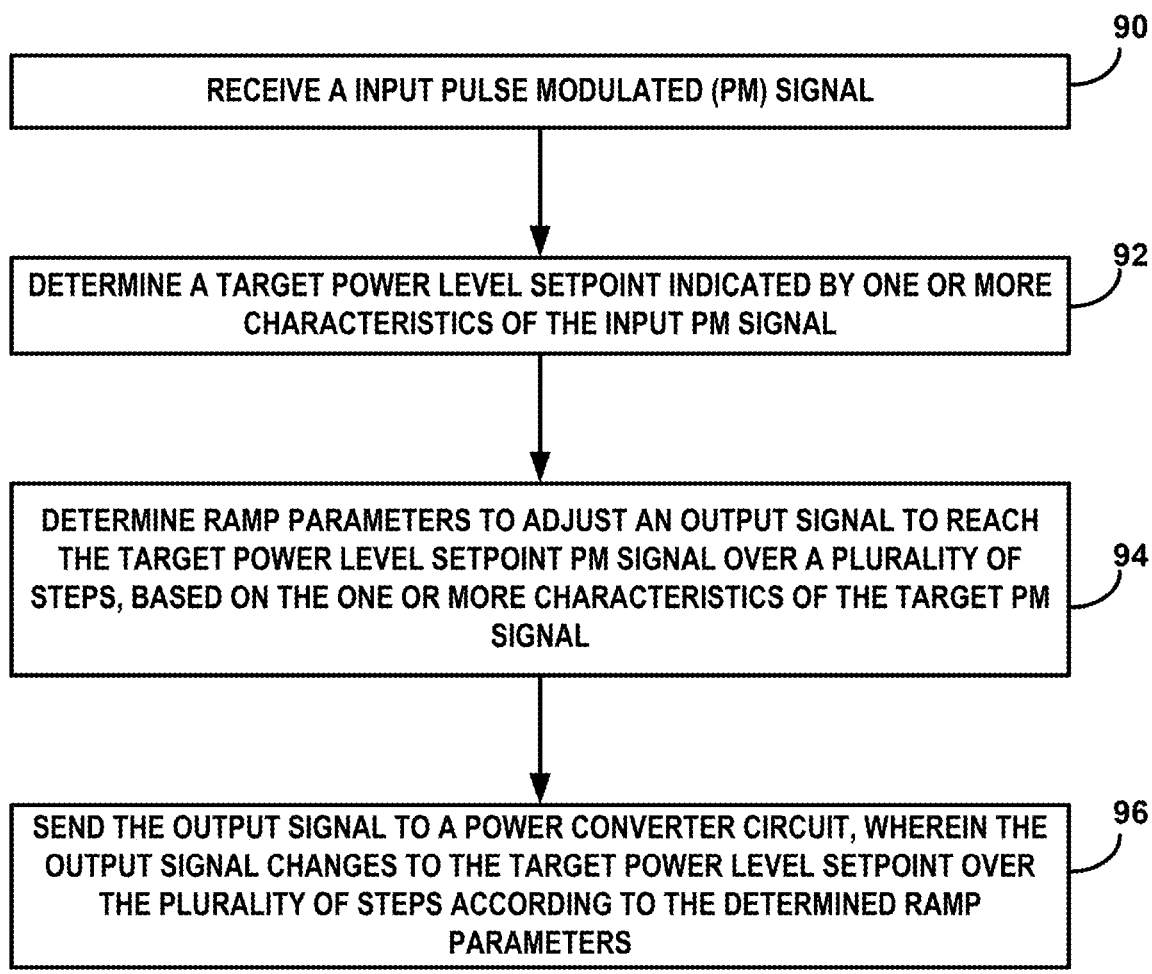
FIG. 6 is a flow diagram illustrating an example operation of one or more techniques of this disclosure.

FIG. 6 is a flow diagram illustrating an example operation of one or more techniques of this disclosure. The blocks of FIG. 6 will be described in terms of FIGS. 2 and 4 unless otherwise noted.

A circuit of this disclosure may be configured to receive an input signal, such as PM input signal 100 (FIG. 2), at an input element, such as dimming input terminal 414 (FIG. 4) (90). The target PM signal may come from a controller, such as controller 10 described above in relation to FIG. 1.

The circuit may determine one or more characteristics of the input PM signal, such as frequency or duty cycle, which may include information such as a power level set point for a power converter (92). The circuit may determine ramp parameters to adjust an output signal, such as PM duty cycle filtered signal 114, to reach the target power level setpoint over a series of steps (94). The ramp parameters, e.g. step length 132, may be based on the one or more characteristics of the target PM signal, such as frequency.

The circuit may send the output signal to a power converter circuit, wherein the PM output signal changes to the target PM signal over the plurality of steps according to the determined step parameters (96). As shown in FIG. 2, the circuit may determine a target setpoint signal 110 of 33%. The circuit may output PM duty cycle filtered signal 114 to reach 33% with steps of zero to 12, 12 to 29 and 29 to 33.

In one or more examples, the functions described above may be implemented in hardware, software, firmware, or any combination thereof. For example, the various components of FIGS. 1 and 3, such as controller 10 may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage. Data storage media may be any available media that can be accessed by one or more computers or one or more processors to retrieve instructions, code and/or data structures for implementation of the techniques described in this disclosure.

By way of example, and not limitation, such computer-readable storage media, such as memory 332, can comprise RAM, ROM, EEPROM, magnetic disk storage, or other magnetic storage devices, flash memory, or any other medium that can be used to store desired program code in the form of instructions or data structures and that can be accessed by a computer. It should be understood, however, that computer-readable storage media and data storage media do not include connections, carrier waves, signals, or other transient media, but are instead directed to non-transient, tangible storage media.

Instructions may be executed by one or more processors, such as one or more DSPs, general purpose microprocessors, ASICs, FPGAs, or other equivalent integrated or discrete logic circuitry. Accordingly, the term "processor," as used herein, such as processor 330 or controller and signal generator 320, may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/ or firmware.

The techniques of this disclosure may also be described in the following examples.

Example 1

A method comprising: receiving an input pulse modulated (PM) signal, determining a target power level setpoint indicated by one or more characteristics of the input PM signal, determining ramp parameters to adjust an output signal to reach the target power level setpoint over a plurality of steps, based on the one or more characteristics of the input PM signal and sending the output signal to a power converter circuit, wherein the output signal changes to reach the target power level setpoint over the plurality of steps according to the determined ramp parameters.

Example 2

The method of examples 1, wherein the power level set point determines an output parameter for the power converter circuit.

Example 3

The method of any combination of examples 1-2, wherein the output parameter is output voltage.

Example 4

The method of any combination of examples 1-3, wherein the output parameter is output current.

Example 5

The method of any combination of examples 1-4, wherein the one or more characteristics include the frequency of the input PM signal.

Example 6

The method of any combination of examples 1-5, wherein determining the ramp parameters comprise determining a step length of each step of the plurality of steps.

Example 7

The method of any combination of examples 1-6, wherein determining the ramp parameters comprise determining one or more of a step size, and a number of steps of the plurality of steps.

Example 8

The method of any combination of examples 1-7, wherein determining the one or more characteristics of the input PM signal comprises determining the on-time of the input PM signal.

Example 9

The method of any combination of examples 1-8, wherein determining the one or more characteristics of the input PM signal comprises determining the duty cycle of the input PM signal.

Example 10

A device comprising an input element configured to receive a pulse modulated (PM) input signal, a PM analysis unit configured to determine one or more characteristics of the received PM input signal, a control signal generation unit configured to output a control signal, wherein the control signal generation unit is configured to adjust the control signal to match the a power level setpoint indicated by the PM input signal over a plurality of steps, a ramp parameter determination unit configured to determine parameters of the plurality of steps based on the one or more characteristics of the received PM input signal.

Example 11

The device of example 10, further comprising a power converter circuit, wherein the device is further configured to output a power signal from the power converter circuit to power a load, wherein the control signal controls one or more output parameters of the power signal and the one or more output parameters change over the plurality of steps and according to the determined ramp parameters.

Example 12

The device of any of examples 10-11 or any combination thereof, wherein the one or more output parameters of the power signal comprises a magnitude of voltage, and wherein the magnitude of voltage changes to reach the power level setpoint over the plurality of steps and according to the determined ramp parameters.

Example 13

The device of any combination of examples 10-12, wherein the one or more output parameters of the power signal comprises a magnitude of current, and wherein the magnitude of current changes to reach the power level setpoint over the plurality of steps and according to the determined ramp parameters.

Example 14

The device of any combination of examples 10-13, wherein the one or more characteristics include the frequency of the received PM input signal.

Example 15

The device of any combination of examples 10-14, wherein determining the ramp parameters comprise determining a step length of each step of the plurality of steps.

Example 16

The device of any combination of examples 10-15, wherein determining the ramp parameters comprise determining one or more of a step size, and a number of steps of the plurality of steps.

Example 17

The device of any combination of examples 10-16, wherein determining the one or more characteristics of the received PM input signal comprises determining the duty cycle of the received PM input signal.

Example 18

A system comprising: a detection circuit that includes: an input element configured to receive a pulse modulated (PM) input signal, a PM analysis unit configured to determine one or characteristics of the received PM input signal wherein the one or more characteristics of the received PM input signal defines a power level set point for the power converter circuit, a control generation unit configured to output a PM output signal, wherein the control generation unit is configured to adjust the control signal to match the power level set point indicated by the PM input signal over a plurality of steps; and a ramp parameter determination unit configured to determine parameters of the plurality of steps based on the one or more characteristics of the received PM input signal. The system also includes a power converter circuit configured to output electrical power to a load, wherein the PM output signal controls a magnitude of the electrical power to change over the plurality of steps and according to the determined ramp parameters, such that the magnitude of power reaches the power level set point.

Example 19

The system of example 18, wherein the one or more characteristics include the frequency of the received PM input signal.

Example 20

The system of any combination of examples 18-19, wherein determining the ramp parameters comprise determining a step length of each step of the plurality of steps.

Various examples of the disclosure have been described. These and other examples are within the scope of the following claims.

The invention claimed is:

1. A method comprising:
    receiving an input pulse modulated (PM) signal;
    determining a target power level setpoint indicated by one or more characteristics of the input PM signal;
    determining ramp parameters to adjust an output signal to reach the target power level setpoint over a plurality of steps, based on the one or more characteristics of the input PM signal; and
    sending the output signal to a power converter circuit, wherein the output signal changes to reach the target power level setpoint over the plurality of steps according to the determined ramp parameters.

2. The method of claim 1, wherein the target power level set point determines an output parameter for the power converter circuit.

3. The method of claim 2, wherein the output parameter is output voltage.

4. The method of claim 3, wherein the output parameter is output current.

5. The method of claim 1, wherein the one or more characteristics include a frequency of the input PM signal.

6. The method of claim 1, wherein determining the ramp parameters comprise determining a step length of each step of the plurality of steps.

7. The method of claim 1, wherein determining the ramp parameters comprise determining one or more of a step size, and a number of steps of the plurality of steps.

8. The method of claim 1, wherein determining the one or more characteristics of the input PM signal comprises determining an on-time of the input PM signal.

9. The method of claim 1, wherein determining the one or more characteristics of the input PM signal comprises determining a duty cycle of the input PM signal.

10. A device comprising:
    an input element configured to receive a pulse modulated (PM) input signal;
    a PM analysis unit configured to determine one or more characteristics of the received PM input signal;
    a control signal generation unit configured to output a control signal, wherein the control signal generation unit is configured to adjust the control signal to match a power level setpoint indicated by the PM input signal over a plurality of steps; and a ramp parameter determination unit configured to determine parameters of the plurality of steps based on the one or more characteristics of the received PM input signal.

11. The device of claim 10, further comprising a power converter circuit, wherein the device is further configured to output a power signal from the power converter circuit to power a load, wherein the control signal controls one or more output parameters of the power signal and the one or more output parameters change over the plurality of steps and according to the determined ramp parameters.

12. The device of claim 10, wherein the one or more output parameters of the power signal comprises a magnitude of current, and wherein the magnitude of current changes to reach the power level setpoint over the plurality of steps and according to the determined ramp parameters.

13. The device of claim 10, wherein the one or more output parameters of the power signal comprises a magnitude of voltage, and wherein the magnitude of voltage changes to reach the power level setpoint over the plurality of steps and according to the determined ramp parameters.

14. The device of claim 10, wherein the one or more characteristics include a frequency of the received PM input signal.

15. The device of claim 10, wherein determining the ramp parameters comprises determining a step length of each step of the plurality of steps.

16. The device of claim 10, wherein determining the ramp parameters comprise determining one or more of a step size, and a number of steps of the plurality of steps.

17. The device of claim 10, wherein determining the one or more characteristics of the received PM input signal comprises determining a duty cycle of the received PM input signal.

18. A system comprising:
a detection circuit that includes:
an input element configured to receive a pulse modulated (PM) input signal;
a PM analysis unit configured to determine one or characteristics of the received PM input signal wherein the one or more characteristics of the received PM input signal defines a power level set point for the power converter circuit;
a control signal generation unit configured to output a control signal, wherein the PM signal generation unit is configured to adjust the control signal to match the power level set point indicated by the PM input signal over a plurality of steps; and
a ramp parameter determination unit configured to determine parameters of the plurality of steps based on the one or more characteristics of the received PM input signal; and
a power converter circuit configured to output electrical power to a load, wherein the PM output signal controls a magnitude of the electrical power to change over the plurality of steps and according to the determined ramp parameters, such that the magnitude of the electrical power reaches the power level set point.

19. The system of claim 18, wherein the one or more characteristics include a frequency of the received PM input signal.

20. The system of claim 18, wherein determining the ramp parameters comprise determining a step length of each step of the plurality of steps.

* * * * *